United States Patent
Han et al.

(10) Patent No.: US 10,483,415 B2
(45) Date of Patent: *Nov. 19, 2019

(54) METHODS TO INTRODUCE SUB-MICROMETER, SYMMETRY-BREAKING SURFACE CORRUGATION TO SILICON SUBSTRATES TO INCREASE LIGHT TRAPPING

(71) Applicant: STC.UNM, Albuquerque, NM (US)

(72) Inventors: Sang Eon Han, Albuquerque, NM (US); Brittany R. Hoard, Albuquerque, NM (US); Sang M. Han, Albuquerque, NM (US); Swapnadip Ghosh, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/904,296

(22) Filed: Feb. 23, 2018

(65) Prior Publication Data

US 2018/0190841 A1  Jul. 5, 2018

Related U.S. Application Data

(63) Continuation of application No. 15/389,936, filed on Dec. 23, 2016, now Pat. No. 9,941,426, which is a (Continued)

(51) Int. Cl.
  *G02B 1/00* (2006.01)
  *H01L 31/0236* (2006.01)
  (Continued)

(52) U.S. Cl.
  CPC ........ *H01L 31/02363* (2013.01); *G02B 1/005* (2013.01); *H01L 31/0747* (2013.01);
  (Continued)

(58) Field of Classification Search
  CPC . H03H 9/10; H03H 9/145; H09H 9/25; G02B 1/005; H01L 31/02363; H01L 31/0747; H01L 31/1804; H01L 31/202
  See application file for complete search history.

(56) References Cited

U.S. PATENT DOCUMENTS

| | | | | |
|---|---|---|---|---|
| 7,667,238 B2 * | 2/2010 | Erchak | ................... | B82Y 20/00 257/88 |
| 2007/0164367 A1 * | 7/2007 | Forbes | .............. | H01L 21/28079 257/369 |

(Continued)

OTHER PUBLICATIONS

McPeak et al., "Complex Chiral Colloids and Surfaces via High-Index Off-Cut Silicon," Nano Letters, (2014) 14, 2934-2940.

(Continued)

*Primary Examiner* — Long K Tran
(74) *Attorney, Agent, or Firm* — MH2 Technology Law Group LLP

(57) ABSTRACT

Provided is a method for fabricating a nanopatterned surface. The method includes forming a mask on a substrate, patterning the substrate to include a plurality of symmetry-breaking surface corrugations, and removing the mask. The mask includes a pattern defined by mask material portions that cover first surface portions of the substrate and a plurality of mask space portions that expose second surface portions of the substrate, wherein the plurality of mask space portions are arranged in a lattice arrangement having a row and column, and the row is not oriented parallel to a [110] direction of the substrate. The patterning the substrate includes anisotropically removing portions of the substrate exposed by the plurality of spaces.

12 Claims, 14 Drawing Sheets

Related U.S. Application Data continuation of application No. 15/030,039, filed as application No. PCT/US2014/061178 on Oct. 17, 2014, now Pat. No. 9,530,906.

(60) Provisional application No. 61/892,950, filed on Oct. 18, 2013, provisional application No. 62/065,081, filed on Oct. 17, 2014.

(51) Int. Cl.
| | |
|---|---|
| *H01L 31/18* | (2006.01) |
| *H01L 31/0747* | (2012.01) |
| *H01L 31/20* | (2006.01) |
| *H03H 9/10* | (2006.01) |
| *H03H 9/145* | (2006.01) |
| *H03H 9/25* | (2006.01) |

(52) U.S. Cl.
CPC ........ *H01L 31/1804* (2013.01); *H01L 31/202* (2013.01); *H01L 31/208* (2013.01); *H03H 9/10* (2013.01); *H03H 9/145* (2013.01); *H03H 9/25* (2013.01); *Y02E 10/547* (2013.01); *Y02P 70/521* (2015.11)

(56) References Cited

U.S. PATENT DOCUMENTS

| | | |
|---|---|---|
| 2010/0037954 A1 | 2/2010 | Thony |
| 2010/0051908 A1* | 3/2010 | Snaith ................ H01L 51/0059 257/40 |
| 2010/0071764 A1 | 3/2010 | Kim |
| 2012/0073641 A1 | 3/2012 | Tseng et al. |
| 2012/0133027 A1* | 5/2012 | D'Arrigo .......... H01L 21/02381 257/618 |
| 2012/0319053 A1 | 12/2012 | Kambe et al. |
| 2013/0014814 A1 | 1/2013 | Han et al. |
| 2015/0192271 A1* | 7/2015 | Foley .................. G02B 5/1866 362/293 |

OTHER PUBLICATIONS

International Search Report and Written Report dated Jan. 23, 2015 from International Application No. PCT/US2014/061178, pp. 1-7.

\* cited by examiner

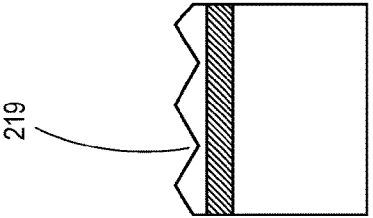
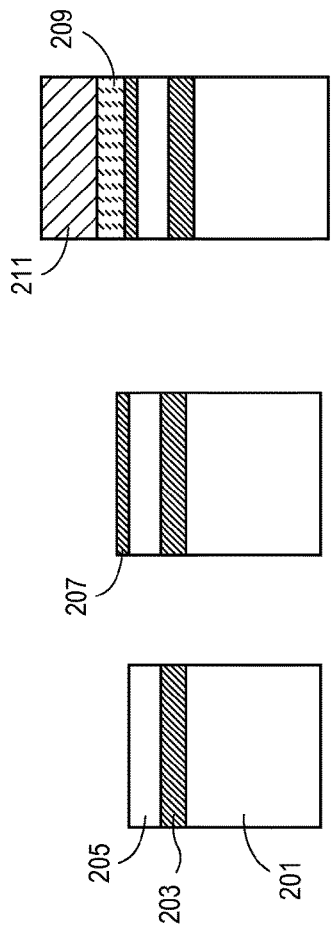
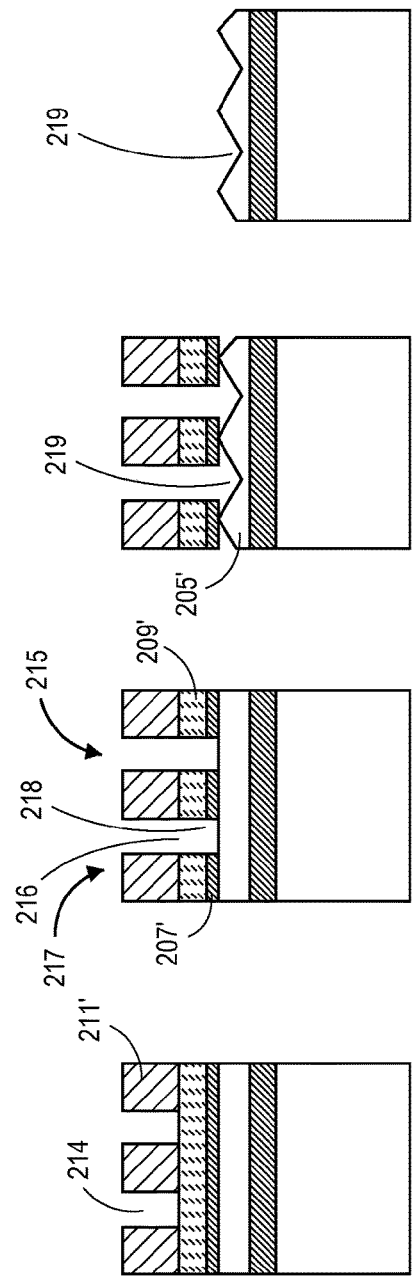

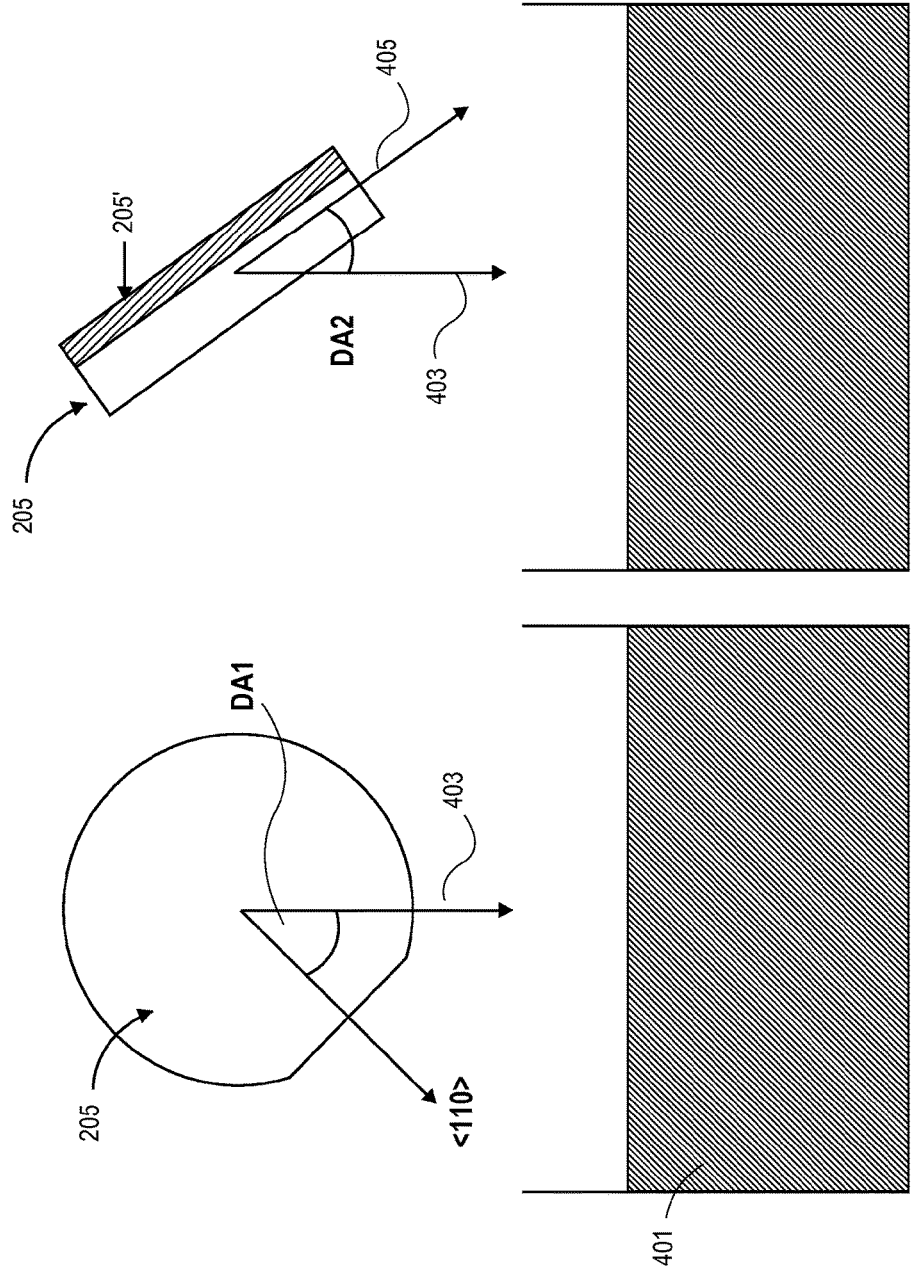

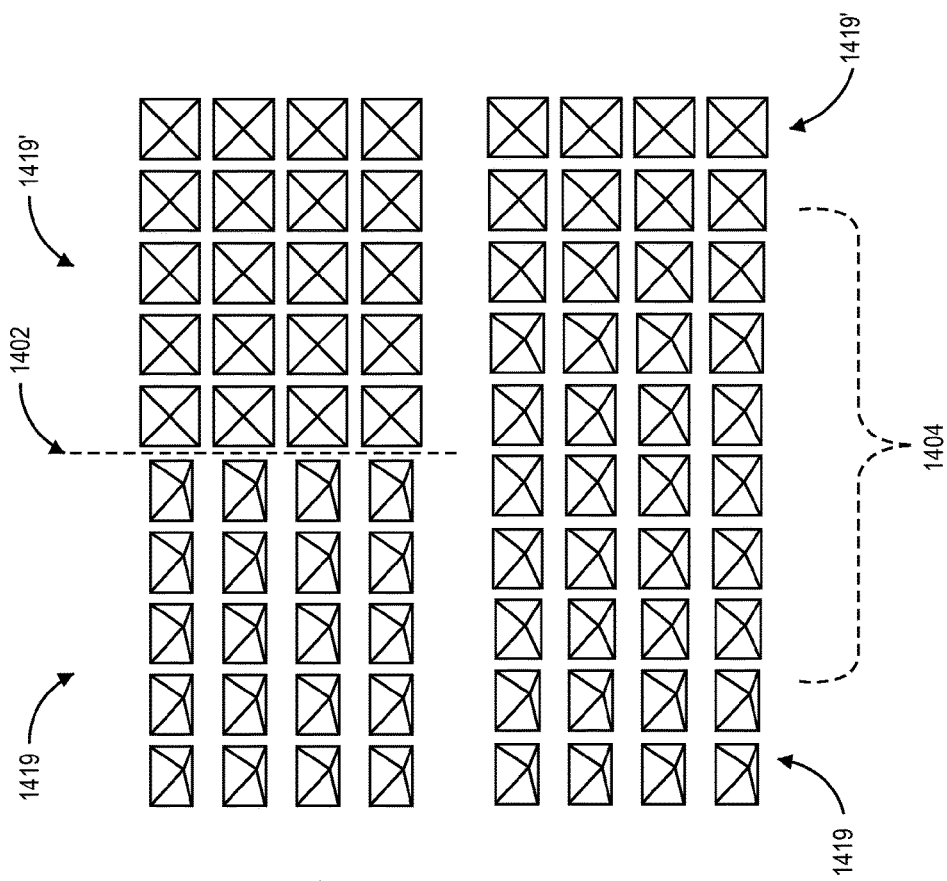

METHODS TO INTRODUCE SUB-MICROMETER, SYMMETRY-BREAKING SURFACE CORRUGATION TO SILICON SUBSTRATES TO INCREASE LIGHT TRAPPING

RELATED APPLICATIONS

This application is a continuation of U.S. patent application Ser. No. 15/389,936 filed Dec. 23, 2016 (now allowed), which is a continuation of U.S. patent application Ser. No. 15/030,039 filed Apr. 15, 2016 (now U.S. Pat. No. 9,530,906 granted on Dec. 27, 2016), which is a 371 U.S. national stage application of International Patent Application No. PCT/US2014/061178 filed Oct. 17, 2014, which claims priority from U.S. Provisional Patent Application Ser. Nos. 61/892,950 filed on Oct. 18, 2013, and 62/065,081 filed on Oct. 17, 2014, the contents of which are hereby incorporated by reference herein in their entireties.

GOVERNMENT SUPPORT STATEMENT

This invention was made with government support under the Oak Ridge Associated Universities (ORAU) Ralph E. Powe Junior Faculty Enhancement Award during the period of Jun. 1, 2013 and May 31, 2014 (no award number was issued), and under the National Science Foundation Sustainable Energy Pathways (NSF-SEP) Program Grant No. CHE-1231046. The government has certain rights in the invention.

FIELD OF THE INVENTION

This disclosure is generally directed to methods by which sub-micrometer, symmetry-breaking surface corrugation can be introduced to silicon substrates. Such symmetry-breaking surface corrugation may be utilized for, among other things, improved light trapping and for, among other things substantially increasing efficiency of Si-based solar cells.

BACKGROUND OF THE INVENTION

The symmetry properties of periodic nanostructures determine their interaction with light. Materials that are periodically structured on an optical length scale, known as photonic crystals, can exhibit exotic optical properties, such as lossless reflection, superprism effect, and high-quality-factor (Q) resonance. The optical properties of the photonic crystals are determined by the coupling of the electromagnetic states (i.e., energy, wave vector, and polarization) in the materials to outside radiation. The structural symmetry plays a key role in the selection of the states to be coupled to the external radiation. For example, certain states are forbidden to couple to incident radiation because of the symmetry mismatch between the states and the light. As a consequence of the uncoupling, light absorption and emission are minimal at the frequencies of such uncoupled states. Thus, symmetry control is important in optical and optoelectronic devices that consist of photonic nanostructures.

When the incident light and the electromagnetic eigenstate in the structure have the same symmetry, their interaction is possible. Oppositely, if their symmetry is dissimilar, they are orthogonal to each other and the incident light is reflected. In nanostructured optoelectronic devices, optical absorption or emission is facilitated by resonant coupling between the eigenfield and the propagating light. For example, in solar cells, optical absorption happens strongly at resonance and a number of absorption peaks can arise in the spectrum. In general, the efficiency of the solar cells will increase as the number of absorption peaks in a spectral range increases. These resonant absorption peaks are possible only when the symmetries of the incident light and the eigenmode match each other. Because of this strict symmetry condition for the coupling of the photonic mode to light, many modes cannot be excited in highly symmetric structures. However, when the symmetry of the structures is lowered, the number of resonant peaks increases and hence the device efficiency is enhanced.

Crystalline silicon (c-Si) solar cells utilize c-Si wafers that are typically 100-300 μm thick. Such thick wafers comprise a significant portion of the overall cost of solar modules. The use of thinner c-Si films having a thickness of from about 1 to about 10 μm would be desirable for reducing the cost. However, the optical absorption in such thin c-Si films is much less than that of thick films, and highly efficient light trapping is necessary to achieve the comparable level of efficiency of the thick films.

For crystalline silicon (c-Si) based solar cells, light absorption near the bandgap is relatively weak. Meanwhile, various light-trapping schemes exist today to enhance light absorption. These schemes include light scattering by nanoparticles, random surface corrugation, nanorod arrays, and diffraction gratings. To compensate for their weak absorption, thick c-Si solar cells use light-trapping structures on the order of 10 μm in size, in conjunction with an antireflection (AR) coating, on the front surface of the solar cell facing the sun. This dimension is much larger than the usable wavelengths (300 nm-1.1 μm) of sunlight spectrum, where the wavelength corresponding to the Si bandgap is ~1.1 μm. In this case, ray tracing based on geometric optics is used to find an optimum structure for light-trapping.

Various factors other than symmetry also need to be considered for optimal optical performance depending on applications. For example, for solar photovoltaics, it is important to trap light inside photoactive layers to enhance energy conversion efficiency. For light-trapping, it is desired that the surface nanostructures on substrates, such as c-Si, be tapered. In this case, the optical density changes gradually and the electromagnetic states in the structures couple well to light. As discussed above, thin films of c-Si are highly desirable to reduce the cost of solar cells. However, the light-trapping structures on the order of 10 μm cannot be used in thin films (~1-10 μm) whose thickness is comparable to or less than the typical structure dimension. That is, the size of light-trapping structures for thin films must be of submicron dimensions. In this case, the physical mechanism of light-trapping becomes very different from the case of thick films as the structure size becomes comparable to the solar spectrum wavelengths. Nonetheless, incorporation of sub-micron light-trapping features could reduce the c-Si solar cell thickness by two orders of magnitude, while achieving the same efficiency as thick flat c-Si films with an antireflection coating. However, a full utilization of nanostructure symmetry in optical and optoelectronic devices has been limited by the lack of efficient fabrication methods.

What is needed, therefore, are methods to fabricate structures that utilize symmetry breaking in periodic nanostructures that can be used to obtain desired optical properties in nanophotonic devices. Additionally, it is known that a slow variation in locally periodic nanostructures supports adiabatic transformation of optical waves, making such variations an efficient optical transmission medium. A gradual variation in nanostructure symmetry would be equally efficient to achieve the high transmission for optical waves. However, realizing such gradual change in nanostructure symmetry over a macroscopic range has remained a challenge.

SUMMARY

In an embodiment, there is a method for fabricating a nanopatterned surface. The method can include forming a mask on a single crystal substrate, patterning the substrate to comprise a plurality of symmetry-breaking surface corrugations, and removing the mask. The mask may include a pattern defined by mask material portions that cover first surface portions of the substrate, and a plurality of mask space portions that expose second surface portions of the substrate. The plurality of mask space portions may be arranged in a lattice arrangement having a row and column, and the row may not be oriented parallel to a [110] direction of the substrate. The patterning the substrate may include anisotropically removing portions of the substrate exposed by the plurality of spaces.

In another embodiment there is a solar cell device. The solar cell device can include a cathode, an anode, and at least one patterned layer disposed between the cathode and the anode. A surface of the at least one patterned layer may include a plurality of symmetry-breaking surface corrugations having a symmetry selected from $C_{4v}$, $C_4$, $C_2$ and $C_1$ Advantages of at least one embodiment include new fabrication methods to systematically break the symmetry in periodic nanostructures on crystalline silicon. Such fabrication methods use simple, inexpensive wet etching steps on, among other materials, crystalline silicon (c-Si) (001), surfaces without relying on the use of, for example, expensive off-cut c-Si wafers. Another advantage of at least one embodiment includes elimination of the need for metal nanostructures for light scattering, thereby reducing metal loss. Still another advantage of an embodiment includes an increase in surface area that is either comparable to microscale inverted pyramids or much less than that of nanorod arrays. Further still, another advantage of an embodiment includes the use of symmetry-breaking nanostructures for use in high-efficiency solar cells. For example, structures having various symmetries obtained from fabrication methods described herein of the embodiments may be integrated into technologically important nanophotonic systems such as those used for photovoltaics and optomechanical couplers.

Additional advantages of the embodiments will be set forth in part in the description which follows, and in part will be understood from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

FIGS. 2A-2G are cross-sectional views of stages of fabrication in a method of fabricating a nanopatterned surface.

FIG. 4A illustrates a dipping direction of a silicon substrate defined by a first angle (DA1) relative to the substrates' <110> direction.

FIG. 4B illustrates a dipping direction of a silicon substrate defined by a second angle (DA2) relative to the substrate being dipped vertically.

FIG. 14A is a top view illustration of inverted nanopyramids arranged in various symmetries with an abrupt transition between the symmetries.

FIG. 14A is a top view illustration of inverted nanopyramids arranged in various symmetries with an abrupt transition between the symmetries.

FIG. 14B is a top view illustration of inverted nanopyramids arranged in various symmetries with some of the nanopyramids defining a transition between the various symmetries.

DESCRIPTION OF THE EMBODIMENTS

Figure 1:
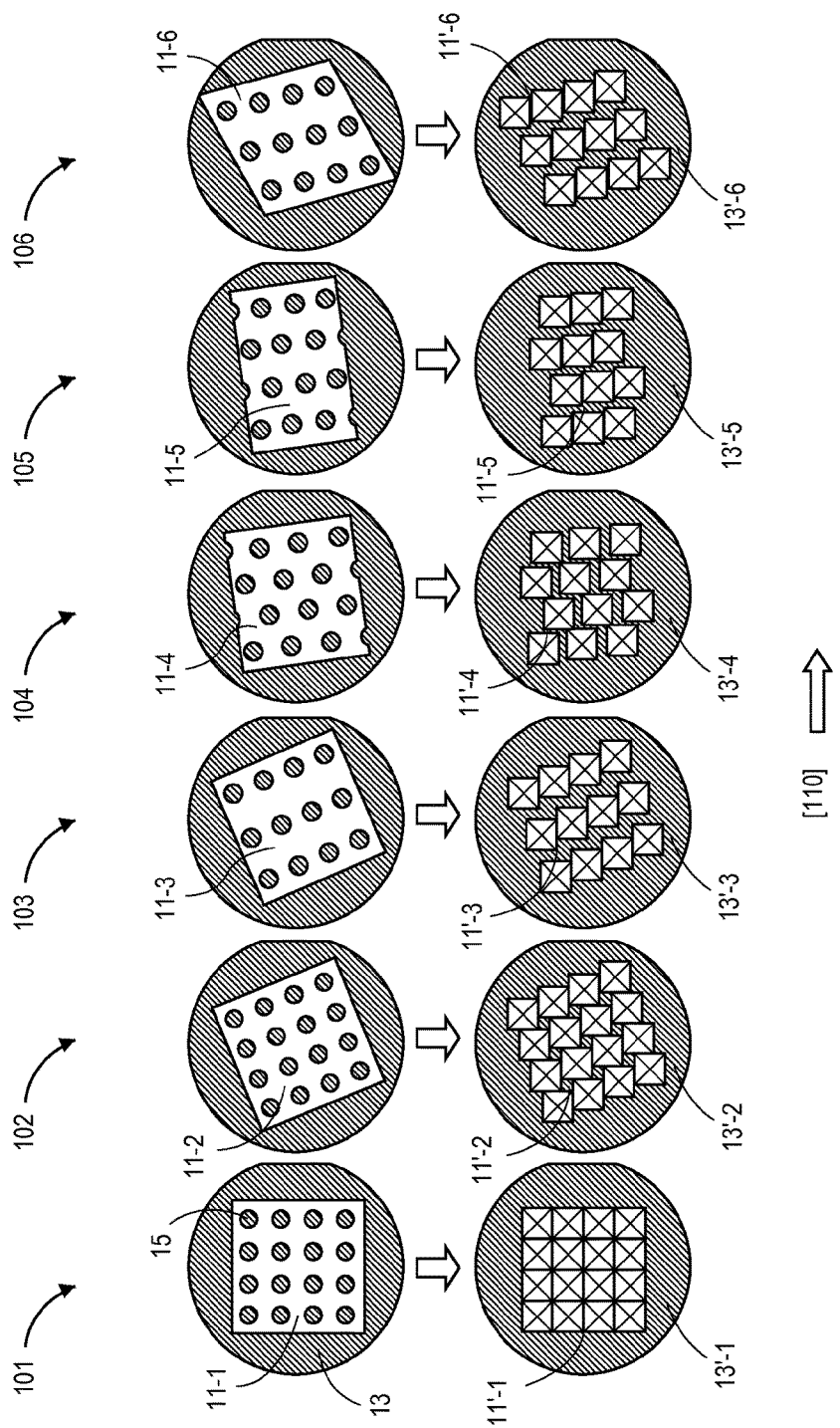
FIG. 1 illustrates a schematic approach to systematically break the symmetry of a pattern by rotating the orientation of an etch template and/or arranging the openings in various lattice types. The resulting symmetries are labeled in Schönflies notation.

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc. As used herein, the phrase "one or more of", for example, A, B, and C means any of the following: either A, B, or C alone; or combinations of two, such as A and B, B and C, and A and C; or combinations of three A, B and C.

The following embodiments are described for illustrative purposes only with reference to the Figures. Those of skill in the art will appreciate that the following description is exemplary in nature, and that various modifications to the parameters set forth herein could be made without departing from the scope of the present invention. It is intended that the specification and examples be considered as examples only. The various embodiments are not necessarily mutually exclusive, as some embodiments can be combined with one or more other embodiments to form new embodiments.

It is believed that symmetry-breaking in periodic nanostructures enhances light-trapping. To illustrate, the solar cells that hold the current record efficiency of 25% use microscopic (~10 μm) inverted pyramid structures. The performance of the inverted pyramid light-trapping is close to the geometric optics limit, known as the Lambertian limit. This limit describes the absorption enhancement relative to a flat film by a factor of $4n^2$, where n is the real part of the refractive index of the film. For c-Si, this enhancement factor is approximately 50 near the Si bandgap, assuming an average n~3.5.

The embodiments described herein provide structures and fabrication methods for providing such structures. The fabrication methods provide structures that exploit optical diffraction over nanoscale structures to efficiently couple light into thin films, such as thin films of c-Si that may be used in photovoltaic devices. The structures of the embodiments rely on fabrication during which steps are taken to systematically break the symmetry in periodic nanostructures, such as those on crystalline silicon. One such fabrication method provides inverted nanopyramid arrays via patterning, wherein the nanopyramids are arranged in various symmetries ranging from $C_{4v}$ to $C_1$, including $C_{4v}$, $C_4$ $C_2$ and $C_1$ symmetry, to enhance light-trapping for applications such as photovoltaics and optomechanical coupling for dynamic control of thermal emission. In one embodiment, methods for fabricating periodic nanostructures with tunable symmetry are provided. The nanostructures may have a periodicity of about 700 nm which is much smaller than the about 10 mm periodicity typically used in thick cells, and may, therefore, be incorporated in thin-film devices such as thin film photovoltaic devices.

Fabrication methods disclosed herein render uniform symmetric and asymmetric nanostructures, or introduce a gradual change to their symmetry over a macroscopic range. Such nanostructures bear unique optical properties with implicit potential to advance various energy technologies, such as radiative heating and/or cooling, solar photovoltaics, light-emission, optical waveguiding, thermal imaging, and the like.

In general, methods of the embodiments described herein include etching, such as wet-etching, of substrate surfaces. When a periodically nanopatterned etch mask is placed on a substrate surface, for example, a single crystal substrate surface such as the surface of c-Si (001), alkaline wet etching may result in the formation of inverted nanopyramid arrays on the surface. Such inverted nanopyramid arrays may result from a much slower etch rate on (111) surfaces than etch rates on other surface orientations, thus exposing (111) surfaces in the inverted nanopyramids. Accordingly, methods of the embodiments described herein exploit the use of various etch template/mask patterns, etch chemistries, and manipulation of etch reactant/byproduct transport, for example via dipping direction or dipping orientation of the material being etched in the etchant, to achieve desired symmetry and/or gradual changes in symmetry.

As shown in FIG. 1, various approaches 101 through 106 for breaking the symmetry in inverted nanopyramid arrays with each symmetry group denoted by the Schönflies notation. The top row of wafers, for example, single crystal substrates 13, such as wafers of c-Si, in FIG. 1 are shown covered by corresponding etch templates 11-1 through 11-6, each having windows 15 that expose surface portions of the underlying substrate 13. The bottom row of wafers, patterned substrates 13'-1 through 13'-6 in FIG. 1, are shown with various arrays of corrugated structures 11'-1 through 11'-2, such as arrays of nanoscale corrugated structures comprising inverted nanopyramid arrays, resulting from patterning, such as via wet-etching the surface portions of substrate 13 exposed through the windows. Corresponding symmetries of the arrays 11'-1 through 11'-6, including $C_{4v}$, $C_4$ and $C_2$ symmetries, are labeled in Schönflies notation next to each of patterned substrates 13'-1 through 13'-6.

The templates, such as etch masks, may include a pattern, wherein the pattern is defined by mask material portions that cover first surface portions of the substrate and a plurality of mask space portions that expose second surface portions of the underlying substrate. The plurality of mask space portions may be arranged in a lattice arrangement having a row and column. In one embodiment, the row, such as the row of mask space portions, is not oriented parallel to a [110] direction of the substrate. For example, mask space portions, which can be openings, may be circular or elliptical windows, such as etch windows, shown as open submicron windows 15 in each of the templates 11-1 through 11-6. Windows may be formed by removing material or materials included in the etch templates, for example, by at least one of lithography and/or dry etching. In an embodiment, interferometric or nanoimprint lithography may be used for forming the submicron windows. As described above, the submicron windows expose surface portions of the underlying substrate and the underlying substrate may be patterned to form corresponding ones of patterned substrates 13'-1 through 13'-6. For example, portions of the substrate exposed through the submicron windows may be etched, such as in an alkaline solution, to create the corresponding arrays 11'-1 through 11'6 of inverted nanopyramids in each of the patterned substrates 13'-1 through 13'6 as shown in the bottom row of FIG. 1.

Array 11'-1 is arranged in a square lattice with $C_{4v}$ symmetry with its side parallel to the [110] direction (as indicated by the right-pointing arrow) and provides a basis for comparing with the other arrays. A first level of symmetry-breaking may be achieved by rotating the etch template 11-1 and, therefore, the side of its square lattice, or, for example, the row of openings in the etch template mask, around the [001] axis, such that the row is at a non-zero angle relative to the [110] direction, as shown by the orientation of etch template 11-2 which is slightly rotated from that of 11-1. This lattice rotation effectively causes the plurality of mask space portions, here, the windows which are arranged in a lattice arrangement having a row and column, to have a row that is not oriented parallel to a [110] direction of the substrate. Each resulting inverted nanopyramid formed in the substrate via, for example, contacting etchant solution to the substrate through the mask space portions (i.e., through the openings of the mask) to be rotated around its own apex as shown in array 11'-2 compared to array 11'-1. Consequently, in array 11'-2 the mirror symmetry of array 11'-1 is completely broken while the 4-fold rotational symmetry is preserved. In addition to the rotation, the symmetry can be further broken by arranging the etch windows in non-square-lattice patterns. For example, possible two-dimensional non-square lattices are a rectangular lattice of template 11-3, a triangular lattice of template 11-4, a centered-rectangular lattice of template 11-5, and an oblique lattices of template 11-6. Utilizing the sequence of symmetry-breaking described above, for example, by orienting the corresponding template at an angle relative to the underlying substrates [110] direction and/or arranging the etch windows in non-square-lattice patterns, the symmetry of inverted nanopyramid arrays can be reduced down to $C_2$.

Accordingly, in an embodiment, a method by which sub-micrometer, symmetry-breaking surface corrugation is introduced to silicon (Si) using wet chemistry is provided. Such symmetry-breaking surface corrugation may be used for improving light trapping which may lead to substantial increases in efficiency of Si-based solar cells. In such a method, interferometric lithography (IL) may be used to fabricate a variety of etch templates that serve as a mask during chemical etching of the surface of the underlying silicon substrate. Each template may include a dielectric, such as thermally grown $SiO_2$, an antireflection coating (ARC) that is formed on the thermally grown $SiO_2$, and a photoresist (PR) film, such as a positive photoresist, on the antireflection coating. Depending on the relative angles of IL exposure with respect to <110> orientation of an Si(100) substrate, as well as the pitch of each IL exposure (which may be two exposure steps), various lattice patterns on an etch mask may be formed. In an embodiment, instead of using an etch mask comprising windows, the mask's material portions that cover first surface portions of the substrate may include pillars, such as nanopillars. For example, nanopillars comprising $SiO_2$ may be formed as a mask on the substrates, for example, such as the nanopillars of patterned dielectric layer 207' in FIG. 3A. These 2D lattices of $SiO_2$ nanopillars may then be used as a mask to etch the underlying substrates, such as Si(100), in chemical etchants such as KOH and $HNO_3$/HF solutions.

In other words, forming a mask may include forming a dielectric layer, on the substrate, forming an antireflection coating on the dielectric layer, and forming a photoresist layer on the antireflection coating. Forming the mask may include forming a plurality of spaces and/or forming mask material portions. For example, the plurality of spaces may comprise a plurality of windows extending through each of the dielectric layer, the antireflection coating and the photoresist layer. The mask material portions may comprise a plurality of nanopillars that each comprise portions of each of the dielectric layer, the antireflection coating and the photoresist layer.

Photoresist, such as positive photoresist, that is resistant to lift-off during chemical etching of substrates, such as chemical etching of Si substrates in KOH, may be used in the templates and are resistant to lift-off during chemical etching of Si substrates in KOH. Additionally, volatile hydrogen etchant product ($H_2$) evolves from the substrate surface, for example Si surface, and may be transported around the SiO2 pillars to control the level of asymmetry as discussed above. By properly adjusting the relative angle and pitch of each IL exposure with respect to <100> and adjusting the orientation of substrate plane and surface normal with respect to the etching solution surface normal, symmetry-breaking surface features, such as symmetry-breaking corrugations, for example symmetry-breaking corrugations that define inverted nanopyramids that extend into the substrate, can be formed on the surface of the silicon substrates.

For example, FIGS. 2A-2G show cross-sectional views of stages of fabrication in a method of fabricating a nanopatterned surface. In FIG. 2A, a substrate 205, such as a silicon substrate, for example a single crystal substrate including c-Si, having a thickness of about 500 nm is provided on a dielectric buffer layer 203 formed on a handling layer 201, such as an Si handling layer. Across FIGS. 2B-2F, a mask 207 is formed on the substrate. The mask 207 comprises a plurality of mask space portions 215, which may be windows 15 in FIG. 1, or the spaces between nanopillars 217 as in FIG. 3A, each of which expose surface portions of the substrate 205. As shown in FIG. 2F, the method continues by patterning the substrate 205 to comprise a plurality of symmetry-breaking surface corrugations 205', for example, by anisotropically removing portions of the substrate 205 exposed by the plurality of windows 215. In FIG. 2G the method continues with d removing the mask 207.

As described above with respect to the template/masks of FIG. 1, the plurality of windows 215 in the method illustrated in FIG. 2 may also be arranged in a lattice having a side, wherein the lattice comprises a square lattice, a rectangular lattice, triangular lattice, centered-rectangular lattice, or an oblique lattice, and wherein the side of the lattice is orientated at a non-zero angle around the [001] axis thereby being rotated relative to the [110] direction of the substrate 205.

Returning to FIGS. 2B-2E, forming the mask may include forming a dielectric layer 207 on the substrate 205, forming an antireflection coating 209 on the dielectric layer 207, forming a photoresist layer 211 on the antireflection coating 209, and forming the plurality of mask spaces 215. The plurality of mask spaces may extend through each of the dielectric layer, the antireflection coating and the photoresist layer as shown in FIG. 2E.

Forming the dielectric layer 207 may include oxidizing a surface of the substrate 205. Thus, the dielectric layer 207 may be a thermally grown dielectric layer. If the substrate 205 is a silicon substrate, thermal oxidation thereof will result in growth of a film of $SiO_2$ thereon. Accordingly, dielectric layer may include $SiO_2$. Forming the antireflective coating and forming the photoresist may include sequentially spin coating an ARC layer and then the photoresist film, such as positive photoresist, on the dielectric layer.

Figure 3B:
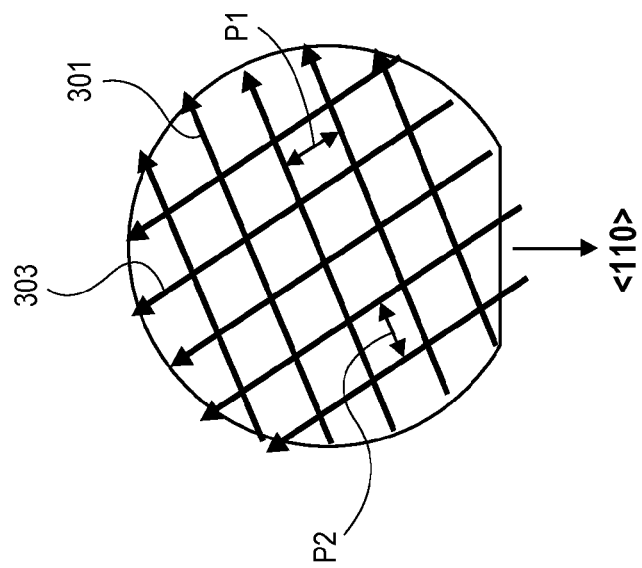
FIG. 3B illustrates the relative direction of first and second interferometric lithography exposures superimposed on a surface of a silicon substrate.
Figure 3A:
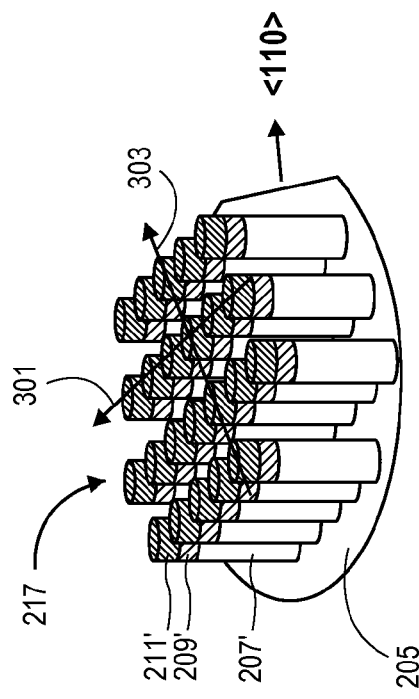
FIG. 3A is a magnified perspective representation of a mask formed on a surface of a silicon substrate and shows relative direction of first and second interferometric lithography exposures.

Forming the plurality of mask spaces may include patterning the photoresist layer 211, to form patterned photoresist 211' and to include first portions 214 of the plurality of mask spaces 215. In other words, the first portions 214 of the plurality of mask spaces 215 may extend through the patterned photoresist 211' and expose portions of the anti-reflection coating 209 as shown in FIG. 2D. In an embodiment, patterning the photoresist may include exposing the photoresist to first and second doses of interferometric lithography interference. The first dose of interferometric lithography interference may be provided at a first direction 301, including a first pitch, and the second dose of interferometric lithography interference may be provided at a second direction 303, including a second pitch, as shown in FIGS. 3A-3B, which forms the basis from which a mask having mask spaces with first periodicity P1 and second periodicity P2 can be formed. The first direction 301 and the second direction 303 may be different from one another. The first direction 301 and the second direction 303 may be relative to a preselected crystallographic orientation of the substrate, such as relative to the <110> direction of a c-Si wafer substrate as shown in FIG. 3B. As a result of patterning the photoresist layer 211, first portions 214 of the plurality of mask spaces 215 may be formed.

Forming the plurality of mask spaces 215 may continue by patterning the antireflective coating 209 to include second portions 216 of the plurality of mask spaces 215. For example, the patterning of the antireflective coating 209 may include removing portions of the antireflective coating 209 exposed by the first portion 214 of the plurality of mask spaces 215 as shown in FIG. 2E. In an embodiment, patterning the antireflective coating 209 may include reactive ion etching the antireflective coating. As a result of patterning the antireflective coating, second portions 216 of the plurality of mask spaces 215 may be formed.

Second portions 216 of the plurality of mask spaces 215 may connect with and extend from the first portion 214 of the plurality of mask spaces 215 and through the patterned antireflective coating 209' to expose portions of the dielectric layer 207 which may be subsequently removed. For example, the forming of the plurality of mask spaces 215 may continue by patterning the dielectric layer 207 to form patterned dielectric layer 207' and to include third portions 218 of the plurality of mask spaces 215. For example, patterning the dielectric layer 207 may include removing exposed portions of the dielectric layer. In an embodiment, patterning the dielectric layer may include reactive ion etching the dielectric layer, such as exposed portions of the dielectric layer 207 in CHF3/O2 plasma. A single reactive ion etching process may be used for patterning the antireflective coating 209 and the dielectric layer 207.

As a result of patterning the dielectric layer, third portions 218 of the plurality of mask spaces 215 may be formed. Third portions 218 of the plurality of mask spaces 215 and may connect with and extend from the second portion 216 of the plurality of mask spaces, and through the patterned dielectric layer 207 to expose portions of the substrate 205.

As described above, at FIG. 2F the substrate may be patterned by anisotropically removing portions of the substrate, for example via wet-etching the substrate with potassium hydroxide (KOH) which can react with a surface of the substrate through the plurality of mask spaces 215. The potassium hydroxide etching process produces byproducts, such as mostly Hz, that form at the solution-wafer interface. When the substrate surface with nanoscale corrugation is turned upside down or inclined facing down in the etch solution, the byproduct can accumulate near the surface of inverted nanopyramids and hinder the etching on portions of the nanopyramids. Thus, varying the substrate inclination angle will affect the local distribution of byproduct concentration at the surface, and the local etch rate within individual inverted nanopyramids will depend on the local byproduct concentration.

For example, as shown in FIGS. 4A-4B, wet-etching the exposed portions of the substrate may include introducing the substrate 205 into a wet-etchant solution 401, for example, at a dipping direction 403. The dipping direction 403 may be defined by at least one of a first rotation angle (DA1) and relative to a predetermined crystallographic direction of the substrate, such as a substrates' <110> direction, such as that shown in FIG. 4A for c-Si, and an inclination angle (DA2) relative to a the dipping direction 403, for example, as defined by the angle between inclination direction 405 and dipping direction 403. The inclination angle, DA2, may be selected from about 25 degrees to about 50 degrees.

While not limited to any particular theory, it is believed that during etching in, for example, KOH, the vertical walls of an inclined wafer will etch faster than the horizontal ones because the byproduct accumulates near the horizontal surfaces. This leads to asymmetry in the shape of resulting inverted nanopyramids. Such asymmetry may be quantified by the aspect ratio of inverted nanopyramid base. Thus, an aspect ratio may be almost 1 at DA2=30° and 2.3 at DA2=40° showing a high sensitivity of the structure to the wafer angle.

Accordingly, the plurality of symmetry-breaking surface corrugations 205' may define an array of inverted nanopyramids 219 that extend into the substrate 205. As described above, the resulting array of inverted nanopyramids may be arranged to have a symmetry selected from $C_{4v}$, $C_4$, $C_2$ and $C_1$ to enhance light-trapping. In the case that the anisotropic etching step leaves flat unetched areas between the inverted nanopyramids, the method may further include a step of etching the substrate isotropically. For example, etching the substrate isotropically may include exposing the substrate to a solution mixture of HNO3 and HF.

Figure 12:
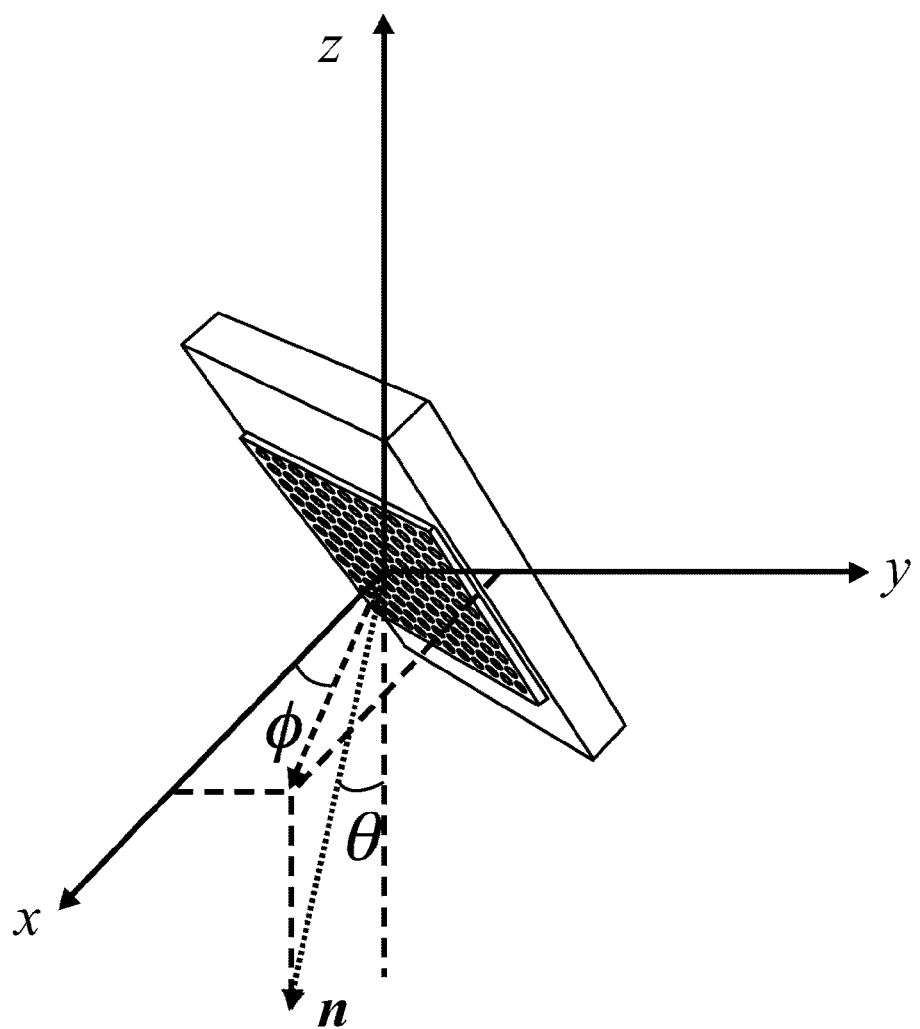
FIG. 12 illustrates a dipping orientation of a substrate, for example, in a wet-etchant solution, defined relative to a surface normal (n) of the substrate surface.

As described above, practice of methods disclosed herein can provide for alterations to substrate surfaces. For example, patterning a substrate, such as by wet-etching of the substrate surface can result in a plurality of symmetry-breaking surface corrugations. In other words, a plurality of symmetry-breaking surface corrugations can be obtained from the symmetry-breaking scheme of the embodiments using wet etching. The result of the methods described above is the patterning of a surface to include an array of symmetry-breaking surface corrugations thereon, such as an array of inverted nanopyramids patterned on a surface of the substrate. The array of surface corrugations, including an array of inverted nanopyramids, may be arranged to have a symmetry selected from one of $C_{4v}$, $C_4$, $C_2$ and $C_1$. In an embodiment, symmetry-breaking, for example, down to $C_1$, may be performed by selecting an appropriate combination of mask window lattice configurations or mask pillar lattice configurations. In an embodiment, symmetry-breaking, for example, down to $C_1$, may be performed by introducing at least a portion of the substrate with the mask into the wet-etchant at a dipping direction. In an embodiment, symmetry-breaking, for example, down to $C_1$, may be performed by providing at least a portion of the substrate with the mask in the wet-etchant at a dipping orientation defined by at least one of a second rotation angle (θ) relative to a surface normal (n) of the substrate; and an orientation angle (ϕ) relative to n, such as illustrated in FIG. 12 and described further below. For example, a method of forming a corrugated surface having $C_1$ symmetry may include forming an etchant mask, such as described in any of FIGS. 1-3B, and patterning the substrate such as via wet-etching, wherein the substrate is introduced into an etchant solution at a rotational angle, DA1 and/or inclination angle, DA2. The step of introducing the substrate into the etchant solution may include changing at least one of DA1 and DA2 as the substrate is contacted by the wet-etchant solution. For example, a method of forming a corrugated surface having $C_1$ symmetry may include forming an etchant mask, such as described in any of FIGS. 1-3B, and patterning the substrate such as via wet-etching, wherein the substrate is provided in an etchant solution at a surface normal (n) of the substrate which is inclined from the gravity direction by a polar angle (θ) and is rotated by an azimuthal angle (φ) about the axis parallel to gravity. The step of providing the substrate in the etchant solution may include changing at least one of θ and φ as the substrate is etched by the wet-etchant solution.

By varying the substrate inclination angle θ of the substrate (i.e., an angle relative to a substrate held vertically, such as a c-Si(001) wafer) in a wet-etchant, it is believed that transport of etch byproducts during wet-etching can be controlled or at least affect the local distribution of byproduct concentration at the surface being etched, and the local etch rate within individual inverted nanopyramids will depend on the local byproduct concentration. Additionally, because the byproduct concentration gradually increases from the most deeply immersed edge of the wafer toward the most elevated edge of the wafer, a step of etching the substrate can further include reversing the wafer dipping incline angle in an opposite direction, where the opposite direction is different from the original inclination angle and may be the absolute value of the reverse of the original inclination angle. Accordingly, reverse angle and etch time are selected to maintain pyramid-to-pyramid long-range uniformity while maintaining the short-range asymmetry in the inverted nanopyramids.

Additionally, a gradual or abrupt symmetry transition may be provided to a corrugated surface formed according to methods described herein. For example, while not limited to any particular theory, it is believed that by applying the above-described approach of introducing the substrate to some substrates, such as larger-scale substrates, byproduct concentration gradually increases from the most deeply immersed edge of the substrate towards the most elevated edge of the substrate. Thus, the effect of symmetry-breaking by the etch byproduct will be minimal in the deeply immersed region where the byproduct is mostly depleted while it will be pronounced in the elevated region. Therefore, the substrate tilting can induce long-range gradual transition in the symmetry of the nanostructures. Accordingly, in an embodiment, the plurality of symmetry-breaking surface corrugations may be formed to comprise first ones of the plurality of symmetry-breaking surface corrugations having a first symmetry and second ones of the plurality of symmetry-breaking surface corrugations having a second symmetry, wherein the first and second symmetries are different. In an embodiment, the plurality of symmetry-breaking surface corrugations may be formed to further comprise third ones of the plurality of the symmetry-breaking surface corrugations disposed between the first and second ones, wherein the third ones are oriented to provide a symmetry transition between the first symmetry and the second symmetry.

Figure 5:
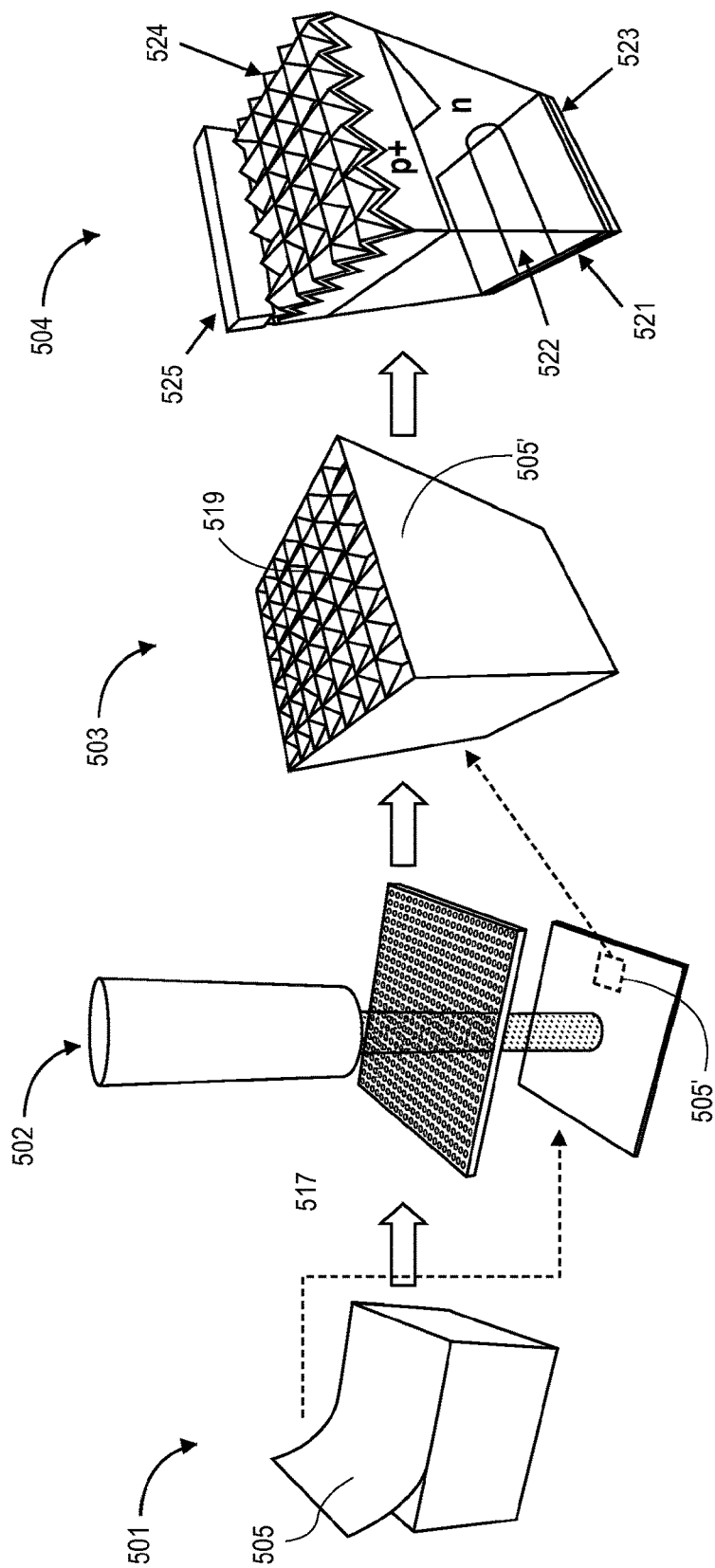
FIG. 5 is a flow diagram, highlighting key steps via schematic representations of of a corresponding manufacturing process for introducing nanoscale surface corrugation to high-efficiency photovoltaic solar cells based on thin c-Si.

Steps similar to those described for FIGS. 2A-2D can be utilized in manufacturing of solar cells. Specifically, the resulting nanocorrugated structure of FIG. 2G can be integrated in a solar cell such as shown in the manufacturing process flow diagram of FIG. 5. In FIG. 5, commercially available 20-μm-thick c-Si substrate films 505 may be produced by a kerfless process at 501. Next at 502, the substrate film surfaces may be patterned according to 505' using Interferometric lithography (IL) with use of a phase-shift photomask 517. The phase-shift photomask (also known as the etch mask) based IL is suitable for large-scale manufacturing. At 503, light trapping nanostructures 519 are created by wet etching. At 504 photovoltaic devices with the light-trapping nanostructures of step 503 are fabricated and characterized. For example, the substrate film is appropriately passivated 521 and doped 522, for example doped n++, if necessary. A back contact 523 may be added on one surface of the substrate and passivation layer and antireflective coating 524 may be formed over the nanostructures. A top contact 525 may be formed over the passivation and anti-reflective coating.

The substrate film surfaces may be patterned at 502 and 503 to form periodic, submicron, symmetric or asymmetric, inverted pyramidal features. The etch mask may be misaligned with respect to the [110] of the silicon substrate and an inclination angle of the substrate in the wet-etch solution may be selected to provide a preselected level of symmetry breaking. In other words, as shown in FIG. 5, a solar cell device at 504, comprising a cathode and anode, for example, the front and back contacts, a patterned layer 505, such as an absorber layer, disposed between the cathode and the anode, and a surface of the patterned layer comprising a plurality of symmetry-breaking surface corrugations 505' having symmetry selected from at least one of $C_{4v}$, $C_4$, $C_2$ and $C_1$. The at least one patterned layer may comprise a single crystal, such as c-Si. The at least one patterned layer ma comprise an absorber, such as a semiconductor that converts incoming electromagnetic energy into an electron-hole pair therein. The plurality of symmetry-breaking surface corrugations 505' may define an array of inverted nanopyramids 519 that extend into the substrate. Such solar cells can provide greater than 25% photovoltaic efficiency.

Figure 6:
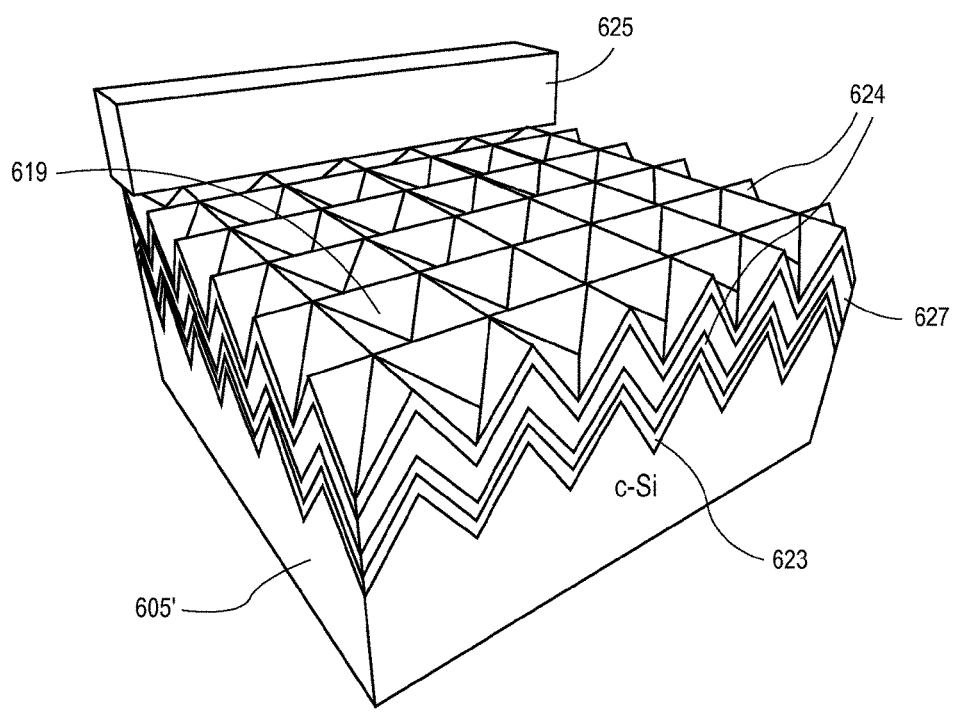
FIG. 6 is a schematic illustration of an a-Si or organic solar cell based on inverted pyramids on c-Si fabricated according to a similar process as that illustrated in FIG. 5 with the addition of steps for depositing an a-Si:H layer or polymer over the nanoscale corrugations on the surface of the c-Si thin film.

Substrates of the embodiments may be selected from c-Si, such as commercially available free-standing kerfless 20-μm-thick c-Si films, for use in fabricating the single junction thin c-Si film photovoltaic cells by replacing the known microscale (~10 μm) light-trapping structures with nanoscale (~700 nm) structures such as symmetry-breaking inverted nanopyramids on c-Si(001) as in FIG. 5. However, other substrates may also be used and other materials may be patterned on the c-Si template comprising the inverted pyramids. For example, as shown in FIG. 6, transparent conducting oxides (TCO) 624, as well as amorphous silicon (a-Si) and/or polymer layers 627 can be deposited conformally on the inverted pyramid arrays 619 of the patterned c-Si substrate 605'. The TCO may be deposited between silver (Ag) and an active material to enhance the adhesion between the active layer and the back contact layers 623. Ag front contact layer 625 may be formed on the TCO. Symmetry of the c-Si template may be broken according to embodiments described above such as by etching the c-Si substrate through windows of a mask arranged in a non-square lattice array having a side that is offset by a predetermined angle relative to the [110] direction.

Ag pyramid arrays may also be used to build organic solar cells. Ag pyramid arrays may be obtained by a method called template stripping. In this method, Ag films are deposited on symmetry inverted pyramid arrays patterned on a substrate. A thick epoxy film is pin coated and cured on the Ag layer, and the composite Ag/epoxy layer is stripped off the C—Si template. With this method, instead of inverted pyramids, pyramidal protrusions of Ag will be obtained. Subsequently, at least one transparent conducting oxide and at least one photoactive polymers are deposited on the Ag structures. Various symmetry cells can be fabricated utilizing the symmetry breaking fabrication methods described herein. Room temperature sputtering for deposition of the transparent conducting oxide film to avoid high temperatures that would be detrimental to the epoxy handling layer.

A transition in structure or refractive index is an efficient method to reduce optical reflection. For example, slow gradual change in structures between two different grating waveguides enable high optical transmission between the two by reducing the impedance mismatch. With slow transition in structure, the optical waves transform gradually when propagating in the structure. Thus, substrates patterned according to the fabrication methods described above, such as to form corrugations on the surfaces thereof, including nanostructures such as inverted nanopyramids arrays, may also serve as negative molds from which positive relief patterns on metal films may be formed. In other words, at least one layer may be deposited on the patterned substrate. The at least one layer may conform to the symmetry-breaking surface corrugations of the patterned substrate and may, in turn, comprises second symmetry-breaking surface corrugations. The at least one layer formed on the substrate may comprise one or more selected from the group consisting of a metal, polymer and a semiconductor. For example, inorganic semiconductor, organic semiconductor or polymer films may also be deposited on such metal films to form, for example, semiconductor metal or polymer-metal stacks that also conform to and attain the corrugated pattern. The inorganic semiconductor may be an amorphous semiconductor such as amorphous silicon ($\alpha$-Si). Accordingly patterned substrates may be used as negative molds on which metal or another material may be deposited. In turn, the deposited material forms to the surface of the negative mold. Thus, in the case of a deposited metal, positive relief metal nanopyramids may be formed. In fact, the substrate's surface may be patterned to include a transition in symmetry such that corrugations comprising an array of nanopyramids may be formed, wherein the array comprises metal pyramids with an abrupt or gradual transition in symmetry.

EXAMPLES

Example 1: Fabrication of Symmetry-Breaking Inverted Nanopyramids on c-Si

To fabricate symmetry-breaking inverted nanopyramids on c-Si, p-type Si(001) wafers with a resistivity of 1-10 $\Omega$-cm were used. An etch template was formed and comprised an SiO2 layer, a photoresist (PR) film on the SiO2 layer, and an anti-reflection coating (ARC) on the photoresist film.

Figure 7:
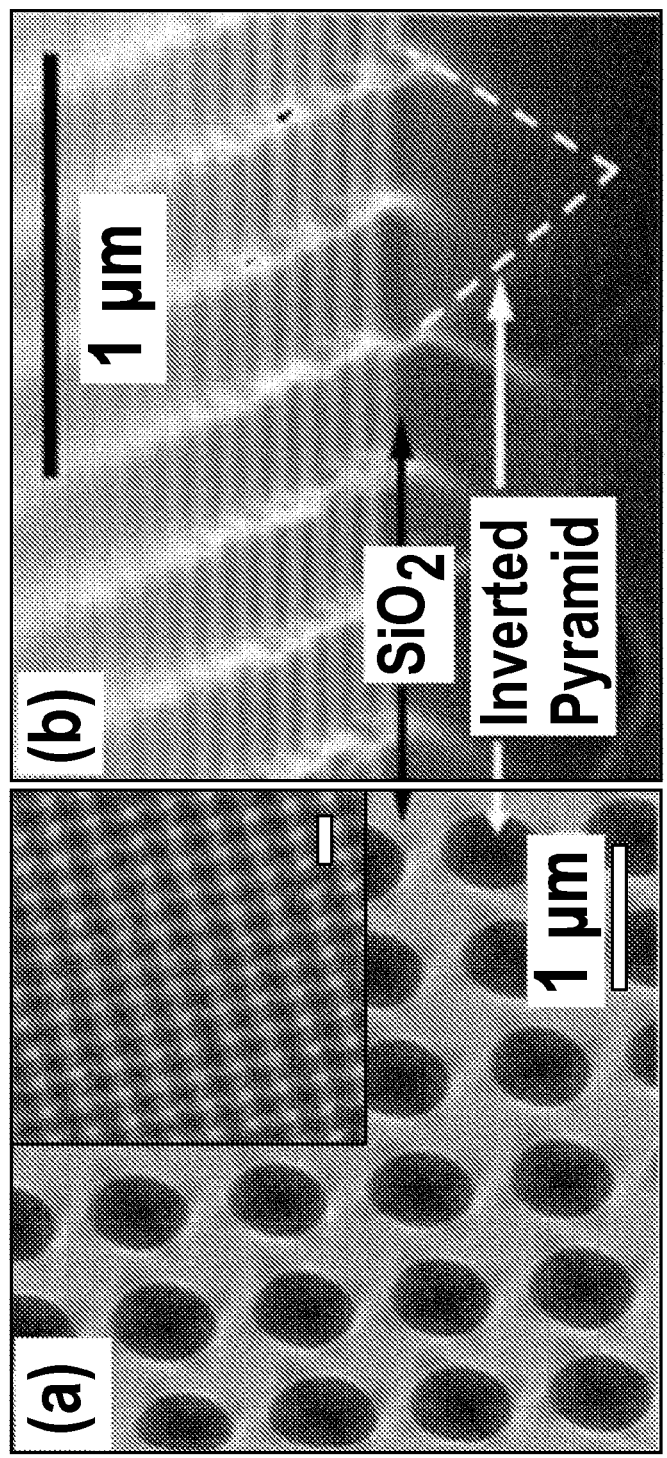
FIG. 7 includes plan view (a) and perspective view (b) scanning electron micrographs of symmetry-breaking inverted nanopyramid arrays. These structures are obtained from an oblique lattice whose side is rotated by approximately 22.5° around the axis. The angle between the two lattice vectors is approximately 97°.

To fabricate the etch template, the SiO2 layer was thermally grown on c-Si prior to lithography forming SiO2/Si. Then, a 70-nm-thick ARC layer and a 500-nm-thick photoresist film were sequentially spin-coated on the SiO2/Si. Interferometric lithography (IL) was used to pattern etch windows through the photoresist film. As described above, the etch windows can be circular or elliptical as shown in FIG. 7 at panel (a), for which major and minor axes are 730 and 540 nm. The pitch varies from 670 to 1000 nm (as shown in FIGS. 7 and 8A-C). After the PR is developed, reactive ion etching in CHF3/O2 plasma was used to create the windows in the SiO2 layer.

The fully developed PR/ARC/SiO2 stack served as a wet etch mask. A 20 wt % KOH solution was used to define the inverted nanopyramids into the underlying c-Si. This anisotropic etching step left flat, unetched areas between the inverted nanopyramids as shown in FIG. 8, which reduce light trapping. To minimize the unetched areas, a solution mixture of HNO3 and HF (300:1) is used to further etch the c-Si isotropically. Acetone rinse was then used to remove the PR. A buffered oxide etch solution was subsequently used to remove the ARC/SiO2 layer from the patterned surface, revealing an array of inverted nanopyramids.

The nanopyramids are imaged either intermittently between the process steps or at the end of fabrication by an FEI Quanta 3D scanning electron microscope (SEM) operating at 15 keV electron beam energy. FIG. 7 includes a SEM images providing different views (a) and (b) of the inverted nanopyramid arrays obtained from a rotated oblique lattice, where the angle between the two lattice vectors is 97°. The side of the lattice is rotated around [001] axis approximately by 22.5° from the [110] direction. The outer set in panel (a) of FIG. 7 shows a partially etched substrate surface under the SiO2 template after 70-second anisotropic etching. The inset in panel (a) of FIG. 7 shows a de-magnified view of the surface after 90-second anisotropic etching, and the bird's eye view of this surface is shown in panel (b) of FIG. 7.

Figure 8C:
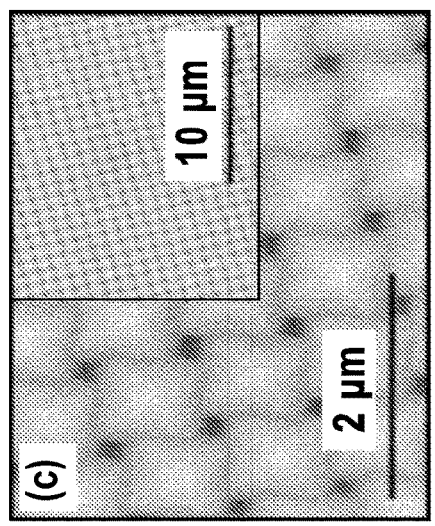
FIGS. 8A-8C are scanning electron micrographs and insets providing corresponding de-magnified views of inverted nanopyramid arrays.
Figure 8B:
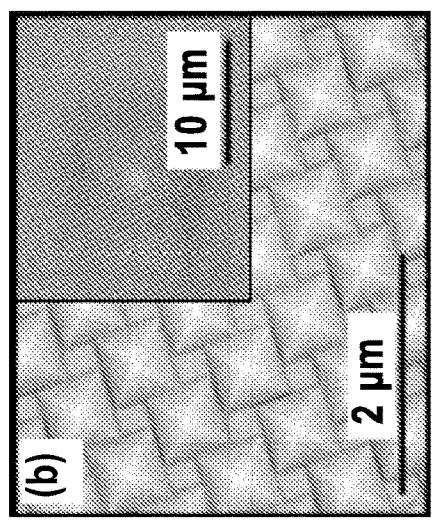
Figure 8A:
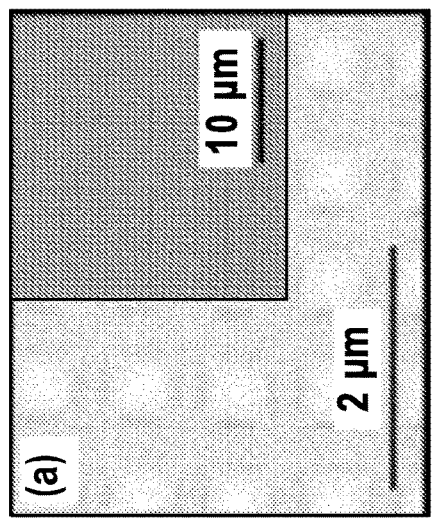

FIGS. 8A-8C are scanning electron micrographs and insets providing corresponding de-magnified views of inverted nanopyramid arrays with $C_{4v}$, $C_4$ and $C_2$ symmetry, respectively. The $C_4$ and the $C_2$ structures were obtained by rotating square and rectangular template lattices as described for the scheme in FIG. 1. The rotation angle $\theta$ was about 22.5°. This angle was chosen to be one half of about 45° to further reduce the symmetry from $C_{4v}$ or $C_{2v}$, either of which results from 0° and 45° rotations. The corresponding insets of FIGS. 8A-8C provide de-magnified views of each structure.

The resulting patterned substrate of FIG. 8A shows inverted nanopyramid arrays with C4v symmetry formed after anisisotropic etching for 70 seconds and subsequent isotropic etching for 0 seconds. The resulting patterned substrate of FIG. 8B shows inverted nanopyramid arrays with $C_4$ symmetry formed after anisotropic etching for 105 seconds and subsequent isotropic etching for 3 seconds. The resulting patterned substrate of FIG. 8C shows inverted nanopyramids with $C_2$ symmetry formed after anisotropic etching for 105 seconds and subsequent isotropic etching for 12 seconds. It is noted that the unetched flat area in FIG. 8B was reduced to that in FIG. 8C by extending the isotropic etching time. Further isotropic etching completely removed these unetched regions. The resulting inverted nanopyramids showed a long-range order over 2.5 cm×2.5 cm substrates. The insets in FIGS. 8A-8C show this uniformity in a de-magnified view.

Example 2: Simulations for Estimating the Level of Enhanced Light Trapping Based on Symmetry Breaking Schemes of Example 1

Figure 9:
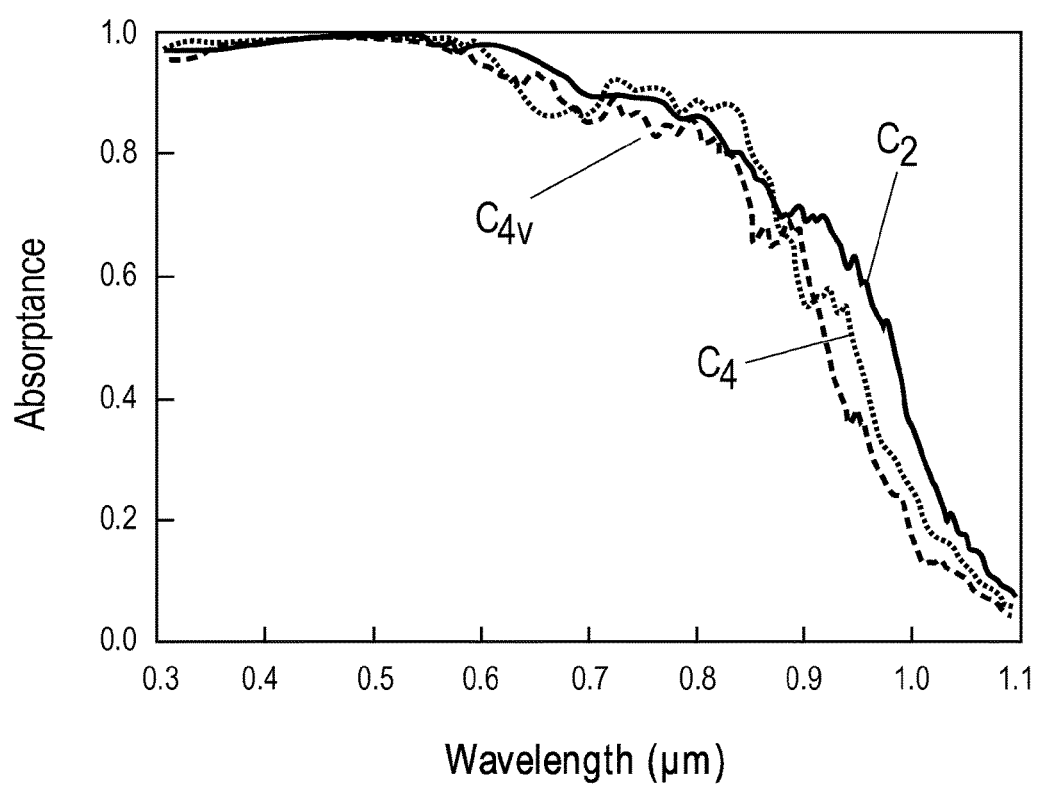
FIG. 9 is a graph showing results for calculated absorptance spectrum in c-Si for the inverted nanopyramid arrays of $C_{4v}$ (dashed), $C_4$ (dotted), and $C_2$ (solid line) symmetry.

To quantitatively estimate the level of enhanced light trapping by the symmetry-breaking scheme of the embodiments, optical absorption in c-Si was calculated for inverted nanopyramid arrays of $C_{4v}$, $C_4$, and $C_2$ symmetries for normally incident light. FIG. 9 shows that, overall, the systematic symmetry-breaking along the $C_4 \rightarrow C_4 \rightarrow C_2$ sequence, as in the embodiments described above, increases the absorption in c-Si. In this calculation, the inverted nanopyramids were simulated as being etched into a 2-μm-thick c-Si film, with a 60-nm-thick $Si_3N_4$ conformal coating having 1.9 refractive index used for anti-reflection. The reason for choosing the thickness of 2 μm was to assess how effectively the symmetry-breaking nanopyramids would trap the light for thin c-Si solar cells as a potential replacement for thick c-Si solar cells. The simulated c-Si film had a 717-nm-thick $SiO_2$ film and a 150-nm-thick Ag layer on the backside as a reflector. For the $C_4$ and $C_2$ structures, the simulated inverted nanopyramids are rotated by 22.5° resulting in structures that correspond to our experimental results of Example 1 of FIGS. 8B and 8C. The $C_{4v}$ and $C_4$ structures exhibited absorption that is independent of the polarization of incident light due to their 4-fold rotational symmetry. This degeneracy was lifted for the $C_2$ structure by breaking the 4-fold rotational symmetry. This results in enhanced absorption over the broad useful sunlight spectrum through the increased number of resonances for unpolarized light.

In FIG. 9, each structure is considered to have maximum performance by varying the periodicity. The performance was characterized by the ultimate efficiency which is defined as the maximum efficiency of a photovoltaic cell as the temperature approaches 0 K when each photon with energy greater than the band gap produces one electron-hole pair, according to equation (I):

$$\eta = \frac{\int_0^{\lambda_g} I(\lambda) A(\lambda) \frac{\lambda}{\lambda_g} d\lambda}{\int_0^{\infty} I(\lambda) d\lambda}, \quad (I)$$

where I is the AM 1.5G solar spectrum, A is the absorptance in c-Si, $\lambda$ is the wavelength, and $\lambda_g$ is the wavelength corresponding to the band gap. The optimized periodicity is 700 nm for both $C_{4v}$ and $C_4$ symmetry inverted nanopyramid arrays.

Figure 10:
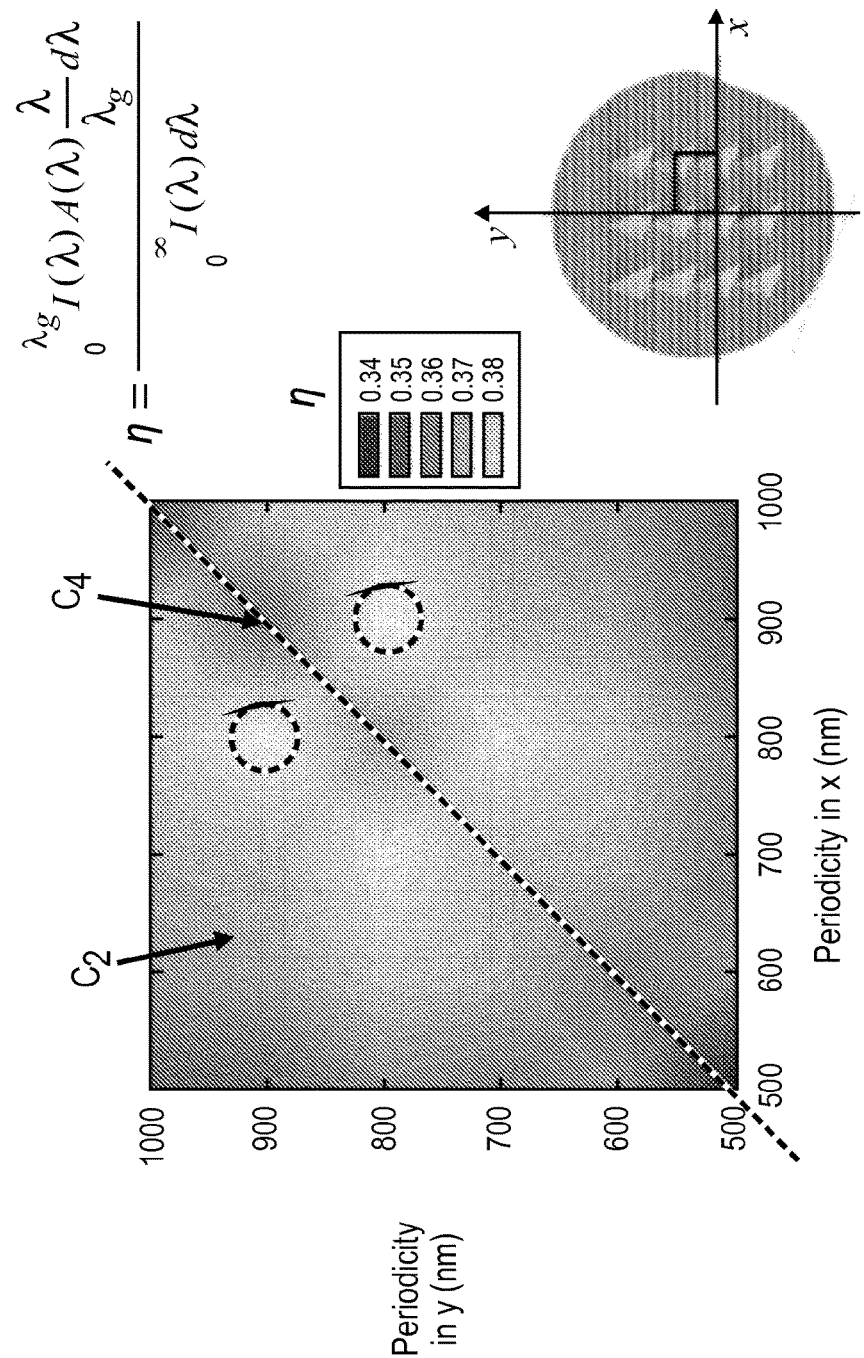
FIG. 10 is a graph showing results for calculated ultimate efficiency for inverted nanopyramid arrays of with various periodicities in x and y directions, where the angle between x-axis and [110] direction is 22.5°.

FIG. 10 shows the efficiency map of the structures for various combinations of periodicities from 500 to 1000 nm in the x and y directions. The angle between the x-axis and the [110] direction is fixed at 22.5o. This map shows that the maximum efficiency occurs when the periodicities are 800 and 900 nm in the x and y directions, respectively. This structure is similar to our experimental structure in FIG. 4C. The optimum periodicities show that, for maximum light trapping with inverted nanopyramids, the symmetry should be broken from $C_4$ to $C_2$ but not by a great degree of change in periodicity from that of $C_4$. The optimum ultimate efficiencies obtained for $C_{4v}$ (not shown in the map), $C_4$, and $C_2$ symmetry inverted nanopyramids are 0.337, 0.350, and 0.362, respectively. This implies that, if a solar cell with $C_{4v}$ inverted nanopyramids has a 25% photovoltaic efficiency at the cell level, the $C_2$ symmetry structures would provide a 26.9% efficiency.

Example 3: Angle Etch Dependence

The KOH wet etching of a nano-templated silicon wafer is dependent on the angle the wafer is heldin solution. This dependence is attributed to hydrogen bubble formation on the surface of the wafer. When held horizontally these hydrogen bubbles become trapped on the surface. This is observed experimentally where small bubbles form on the wafer without releasing. The hydrogen then serves as a masking layer, separating the silicon surface from the KOH solution. By angling the wafer, these bubbles are more easily able to escape thereby reducing the amount of time the surface is masked, increasing the etch rate and improving the overall etch.

Figure 11A:
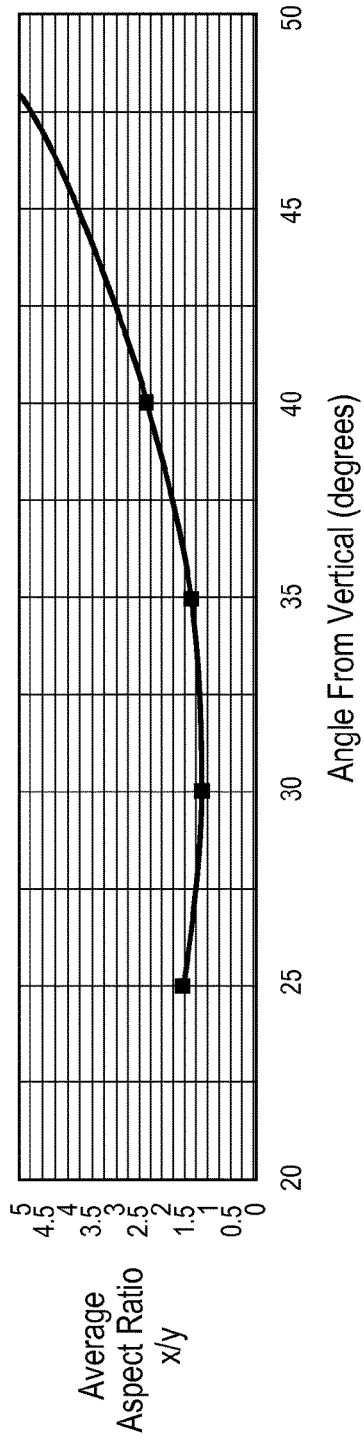
FIGS. 11A-11B are graphs showing results of average aspect ratio x/y upon wet etching silicon wafers at various angles from vertical (degrees) in which the wafer was etched template side down (FIG. 11A) and the wafer was etched template side up (FIG. 11B).
Figure 11B:
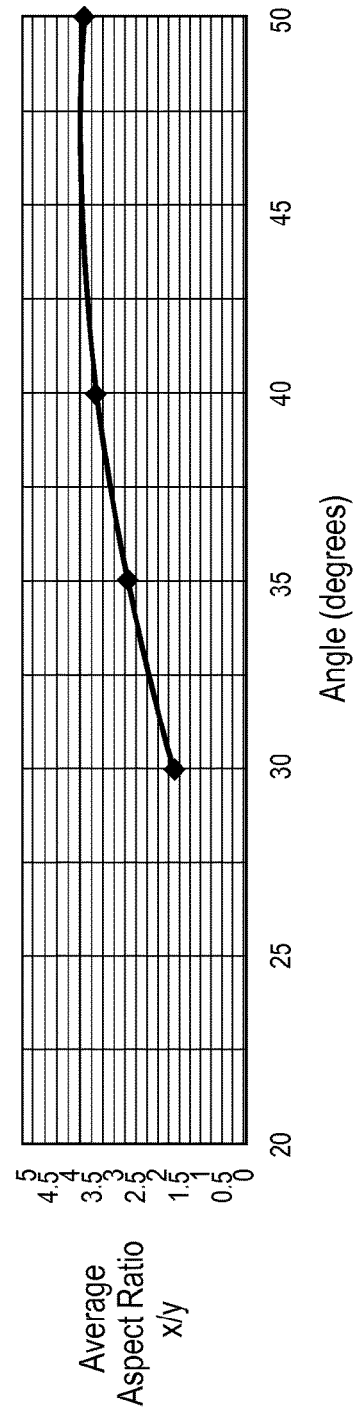

A study of the present invention was conducted to determine the optimal angle to achieve this effect. Wafers were etched at 50, 40, 30 and 25 degrees. For 50, 40 and 30 degrees, one wafer was etched template side down while one wafer was etched template side up. These wafers came from the same substrate with the same pre-treatment. Data collected from a wafer etched at 35 degrees was added to the plot. This wafer did not come from the same substrate as the ones tested at 50, 40 and 30 degrees, however the pre-treatment was identical. In fact, the sample was initially etched at an approximate angle using an old method for 25 seconds. Methods described herein were utilized and the wafer was etched at a known 35° holding angle for an additional 5 seconds. Meanwhile, for the samples tested at 50, 50 and 30 degrees were etched for 15 seconds. From this study the graphs in FIGS. 11A-11B were generated.

There is not a significant difference between the wafers etched template side up and template sidedown. Between 35 and 25 degrees, etch geometry is optimized. A holding angle of 35 degrees was selected for subsequent trials. This angle proved effective in subsequent trials as the etch success rate was increased. KOH etching has a dependence on wafer holding angle, but holding angle is not the only factor. Native oxide formation plays a role as well. This was evidenced by the consistent reduction in etch times for Buffered Oxide Etch (BOE) rinsed wafers. This explains why the 15-30 second etching window was present rather than a consistent etch time. This effect is not related to the crystal structure of silicon. Pattern liftoff is an issue. The faster the etch happens, the more violent the reaction. Quick release of hydrogen along the surface causes pattern liftoff. Accordingly, etch rate actually continues to increase until the wafer is held vertically. Also with the greater process control allowed by the present invention effects of re-introducing stirring is examined. If the angle dependence is purely a result of the hydrogen release issue, stirring diminishes the impact of hydrogen masking and makes holding angle less important.

Example 4: Performance Comparison of Various Light-Trapping Structures

Shockley-Queisser (SQ) efficiency for the inverted nanopyramids formed according to the present embodiments were calculated. The optimum SQ efficiencies obtained for C4v, C4, and C2 symmetry inverted nanopyramids for 20-μm-thick c-Si films are 26.2, 26.9, and 27.6%, respectively.

Example 5: Use of Pillar Mask Patterns for Forming Inverted Nanopyramids

A pillar pattern for an etch mask, such as the pillar pattern etch mask of FIG. 3A, presents an opportunity to reduce the diffusion limitation in the etch reactant/product transport, in contrast to the window pattern etch mask of, for example, FIG. 1, wherein the deep windows may result in diffusion-limited wet etching. Square lattice patterns may be utilized for forming symmetric inverted nanopyramids. Accordingly, in the fabrication method of the embodiments, low-cost normal Si (001) wafers may be patterned by adjusting parameters of a mask pattern, such as a mask comprising windows or formed of nanopillars, to break symmetry such as a rotation angle of the etch mask relative to the [110] direction of the substrate, adjusting and selecting an angle of either of a plurality, such as two, light exposure steps during IL, and additionally varying and selecting a first pitch ($p_i$) and a second pitch ($p_{ii}$) of the etch mask lattice. Resulting corrugations, such as an array of inverted nanopyramids, on the surface of the patterned substrate on which such an etch mask is disposed during etching, may include inverted nanopyramids, each nanopryramid having square or rectangular bases. By modifying the length of anisotropic and isotropic etching, as described above, inverted nanopyramids with reduced symmetry and minimal flat area between each pyramid may be formed. For example, the shape of the individual pyramid base can deviate from the square or rectangular shape. In fact, a curved perimeter for a pyramid base may be formed by adjusting isotropic etching time and by adjusting the surface normal direction of the substrate in the etch solution.

Example 6: Positive Relief Nanostructures on Ag

Nanostructures created on Si(001), such as those created in Example 1 can be used as a negative mold from which nanoscale positive relief patterns on thin Ag films are formed. For example, dilute photoresist may be spin-coated on top of the Si nanostructures. Silver (Ag) may then be sputter-deposited on the photoresist. Amorphous semiconductors or light-absorbing polymers may be formed on the positive relief patterns.

Example 7: Forming an Array of Nanostructures Having Gradual Change in Symmetry

FIG. 12 shows how orientation of an Si substrate in an etchant solution, the orientation defined by a angles θ and φ relative to surface normal (n), can be manipulated in the etch solution. In addition to orientation of the substrate at angles θ and φ relative to the surface normal, the substrate can also be rotated around n as another degree of control. The orientation can be set to one particular position during etching or can be slowly changed over time. In other words, the substrate can be provided in the etch-solution at one orientation during the whole etching period, or may be manipulated while in the etch-solution to more than one, for example, several, orientations during etching.

Figure 13A:
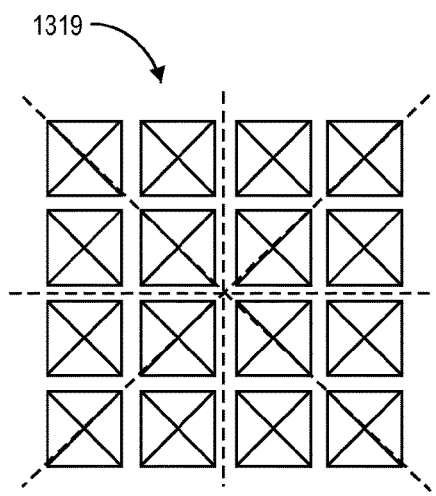
FIG. 13A-D are top view illustrations of inverted nanopyramid arrays of various symmetries.
Figure 13B:
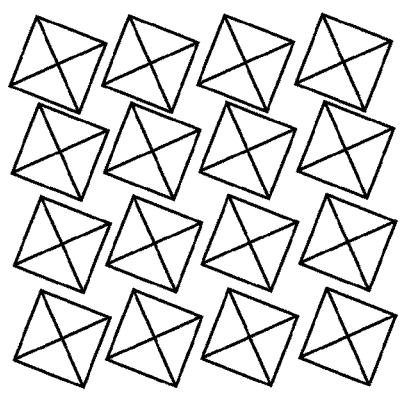
Figure 13C:
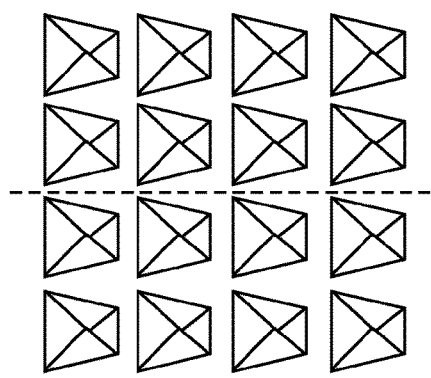
Figure 13D:
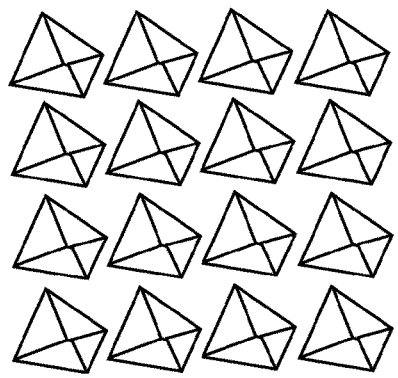

Because of the selected orientation(s) of the mask pattern oriented away from an underlying substrate's crystallographic direction, such as the [110], and/or the orientation at which the substrate with mask is introduced into and/or provided in the etch solution, the surface of the substrate may be patterned with different symmetries. For example, the inverted nanopyramids 1319 illustrated from a top view shown in FIG. 13A, which corresponds to the pattern of arrays of corrugated structures 11'-1 of FIG. 1, has a four-fold rotation axis and four mirror symmetry planes (indicated by dashed lines). However, in the top view shown in FIG. 13B, the mirror symmetry of the inverted nanopyramids is completely broken while the four-fold rotation symmetry remains. A different type of symmetry breaking is possible by using skewed inverted pyramids shown in the top view illustrated in FIG. 13C, where rotational symmetry is absent, and only one minor symmetry plane (dashed line) exists. Meanwhile, the structure shown in the top view illustrated in FIG. 13D is nonsymmetrical.

By taking advantage of the accumulation of etch byproducts at different locations of the substrate as described above, various patterns such as symmetry-breaking surface corrugations may be etched on the surface of a substrate, such as the corrugations described above. For example, etch byproducts near the top of the tilted substrate towards the solution surface, compared to the bottom of the substrate well immersed in the etch solution, leads to gradual changes in etch rate and therefore variation in the symmetry of the etched pattern on the surface of the substrate. Thus appropriate dipping orientation of the substrate in the etch solution may result in formation of symmetry-breaking nanostructures, such as symmetry-breaking surface corrugations, including inverted nanopyramids etched in the surface of the substrate. Additionally, proper selection of the dipping direction and dipping orientation, may be used to introduce the substrate with mask into the etching solution, or providing the substrate with mask in the dipping solution, respectively, to provide variations in symmetry between patterns, which may be surface corrugations, including inverted nanopyramids on the surface of the substrate as discussed above in first patterns 1419 having a first symmetry and second patterns 1419' having a second symmetry, separated by abrupt transitions 1402 between the first and second patterns as shown in FIG. 14A. Furthermore, proper selection of the dipping direction and dipping orientation, may be used to introduce the substrate with mask into the etching solution, or providing the substrate with mask in the dipping solution, respectively, to provide variations in symmetry between first patterns 1419 having a first symmetry and second patterns 1419' having a second symmetry, and at least a third pattern configured in a slow transition 1404 between the first and second patterns as shown in FIG. 14B, which may provide long-range variation in symmetry for the nanostructures.

While the present teachings have been illustrated with respect to one or more implementations, alterations and/or modifications may be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages may be added or existing structural components and/or processing stages may be removed or modified. Further, one or more of the acts depicted herein may be carried out in one or more separate acts and/or phases.

The symmetry-breaking approach of the embodiments described herein may also be applied to other optical material systems, such as organic photovoltaics and optoelectronic devices.

Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items may be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "about" indicates that the value listed may be somewhat altered, as long as the alteration does not result in nonconformance of the process or structure to the illustrated embodiment. The term "conformal" describes a coating material in which angles of the underlying material are preserved by the conformal material. Terms of relative position as used in this application are defined based on a plane parallel to the conventional plane or working surface of a workpiece, regardless of the orientation of the workpiece. Finally, "exemplary" indicates the description is used as an example, rather than implying that it is an ideal.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An optoelectronic device, comprising:
a patterned substrate comprising a surface having a plurality of symmetry-breaking surface corrugations, wherein the symmetry-breaking surface corrugations comprise a symmetry selected from at least one of $C_4$, $C_{2v}$, $C_2$ and $C_1$ wherein the symmetry breaking corrugations comprise a periodicity from 500 nm to 1000 nm in at least two directions; and
at least one layer formed on the patterned substrate.

2. The optoelectronic device of claim 1, wherein the at least one layer comprises one or more selected from the group consisting of a metal, a polymer, and a semiconductor.

3. The optoelectronic device of claim 2, wherein the semiconductor comprises one or more selected from the group consisting of an inorganic semiconductor and an organic semiconductor.

4. The optoelectronic device of claim 3, wherein the inorganic semiconductor comprises amorphous silicon (a-Si).

5. The optoelectronic device of claim 1, wherein the plurality of symmetry-breaking surface corrugations defines an array of inverted nanopyramids.

6. The optoelectronic device of claim 5, wherein the surface comprises flat, unetched areas between the inverted nanopyramids.

7. The optoelectronic device of claim 1, wherein the silicon substrate comprises c-Si.

8. The optoelectronic device of claim 1, wherein the plurality of symmetry-breaking surface corrugations defines an array of pyramidal protrusions.

9. The optoelectronic device of claim 1, wherein the plurality symmetry-breaking surface corrugations have $C_2$ symmetry.

10. The optoelectronic device of claim 1, wherein the at least one layer is conformally disposed on the plurality of symmetry-breaking surface corrugations.

11. The optoelectronic device of claim 1, wherein the at least one layer comprises a polymer layer, a transparent conducting oxide layer, or an amorphous silicon (a-Si) layer conformally disposed on the plurality of symmetry-breaking surface corrugations.

12. The optoelectronic device of claim 1, wherein the at least one layer comprises a plurality of layers, the plurality of layers comprising a front contact layer, a back contact layer and an active layer disposed between front and back contact layers.

* * * * *